(12) United States Patent
Yamamoto

(10) Patent No.: US 9,797,945 B2
(45) Date of Patent: Oct. 24, 2017

(54) SEMICONDUCTOR DEVICE HAVING CIRCUITRY FOR DETECTING ABNORMALITIES IN A POWER SUPPLY WIRING NETWORK

(71) Applicant: Renesas Electronics Corporation, Kawasaki-shi, Kanagawa (JP)

(72) Inventor: Masayuki Yamamoto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 308 days.

(21) Appl. No.: 14/190,335

(22) Filed: Feb. 26, 2014

(65) Prior Publication Data

US 2014/0239989 A1 Aug. 28, 2014

(30) Foreign Application Priority Data

Feb. 28, 2013 (JP) ................................. 2013-038227

(51) Int. Cl.
  *G01R 31/30* (2006.01)
  *G01R 31/317* (2006.01)
(52) U.S. Cl.
  CPC ... *G01R 31/3004* (2013.01); *G01R 31/31721* (2013.01)
(58) Field of Classification Search
  CPC ........ H01L 2224/48247; G01R 31/026; G01R 31/041
  See application file for complete search history.

(56) References Cited

U.S. PATENT DOCUMENTS

| 7,848,169 B2 | 12/2010 | Shikata |
| 8,575,978 B2 | 11/2013 | Komatsu et al. |
| 2008/0283876 A1 | 11/2008 | Souda |
| 2009/0236993 A1* | 9/2009 | Ishii ...................... G09G 3/006 315/129 |
| 2010/0207649 A1* | 8/2010 | Krishnan ........... G01R 31/2894 324/762.02 |

(Continued)

FOREIGN PATENT DOCUMENTS

| JP | H09-138757 A | 5/1997 |
| JP | 2006-119777 A | 5/2006 |

(Continued)

OTHER PUBLICATIONS

Official Action dated Jun. 21, 2016, issued in Japanese counterpart application (No. 2013-038227) with English translation.

(Continued)

*Primary Examiner* — Jermele M Hollington
*Assistant Examiner* — Feba Pothen
(74) *Attorney, Agent, or Firm* — Womble Carlyle

(57) ABSTRACT

A semiconductor device is capable of detecting a power supply voltage abnormality without degrading the performance of internal circuits. The semiconductor device includes a plurality of power supply inspection circuits and a result storage register. The power supply inspection circuits detect a power supply voltage abnormality in each pad that couples an internal wiring disposed in the semiconductor device to another part disposed outside of the semiconductor device. The result storage register stores inspection results indicated by result signals output from the power supply inspection circuits.

13 Claims, 15 Drawing Sheets

(56) References Cited

U.S. PATENT DOCUMENTS

2012/0306540 A1* 12/2012 Komatsu .................. H02H 3/24
  327/77
2013/0120012 A1* 5/2013 Pagani ............... G01R 31/3172
  324/754.03

FOREIGN PATENT DOCUMENTS

| JP | 2009-069947 A | 4/2009 |
| JP | 2011-186744 A | 9/2011 |

OTHER PUBLICATIONS

Official Action dated Dec. 13, 2016, issued in Japanese counterpart application (No. 2013-038227) with English translation.

* cited by examiner

FIG. 8

| MODE | DETECTION SIGNAL | | | | FAILURE MODE | | | | ERROR REGISTER REG | OPERATING MODE SELECTION |
|---|---|---|---|---|---|---|---|---|---|---|
| | S2a | S2b | S4a | S4b | PD1a | PD1b | PD2a | PD2b | | |
| 1 | Pass | Pass | Pass | Pass | — | — | — | — | OK | NORMAL MODE |
| 2 | Fail | Pass | Pass | Pass | OPEN CIRCUIT | — | — | — | WARNING | LOW-SPEED MODE |
| 3 | Pass | Fail | Pass | Pass | — | OPEN CIRCUIT | — | — | WARNING | |
| 4 | Pass | Pass | Fail | Pass | — | — | OPEN CIRCUIT | — | ERROR | STOP MODE |
| 5 | Pass | Pass | Pass | Fail | — | — | — | OPEN CIRCUIT | ERROR | |
| 6 | OTHER THAN ABOVE | | | | OPEN CIRCUIT AT TWO OR MORE TERMINALS | | | | ERROR | |

FIG. 10

| MODE | BIST OPERATING STATE | | DETECTION SIGNAL | | | | FAILURE MODE | | | | ERROR REGISTER | | OPERATING MODE SELECTION |
|---|---|---|---|---|---|---|---|---|---|---|---|---|---|
| | BISTa | BISTb | S2a | S2b | S4a | S4b | PD1a | PD1b | PD2a | PD2b | REGa | REGb | |
| 1 | TEST | TEST | Pass | Pass | Pass | Pass | — | — | — | — | OK | OK | NORMAL MODE |
| 2 | TEST | TEST | Fail | Pass | Pass | Pass | OPEN CIRCUIT | — | — | — | WARNING | OK | LOW-SPEED MODE |
| 3 | TEST | TEST | Pass | Fail | Pass | Pass | — | OPEN CIRCUIT | — | — | OK | WARNING | LOW-SPEED MODE |
| 4 | TEST | TEST | Pass | Pass | Fail | Pass | OPEN CIRCUIT | — | OPEN CIRCUIT | — | ERROR | OK | STOP MODE |
| 51 | TEST | TEST | Fail | Pass | Fail | Pass | — | — | OPEN CIRCUIT | — | ERROR | OK | |
| 52 | TEST | — | Pass | Pass | Pass | Pass | — | — | — | — | — | OK | |
| 53 | TEST | — | Fail | — | Pass | — | — | — | — | — | WARNING | — | |
| 6 | TEST | TEST | Pass | Pass | Pass | Fail | — | — | — | OPEN CIRCUIT | — | ERROR | STOP MODE |
| 71 | TEST | TEST | Pass | Fail | Pass | Fail | — | OPEN CIRCUIT | — | OPEN CIRCUIT | OK | ERROR | |
| 72 | TEST | — | Pass | Pass | Pass | — | — | — | — | — | OK | — | |
| 73 | — | TEST | — | Fail | — | Pass | — | — | — | — | — | WARNING | |
| 8 | OTHER THAN ABOVE | | | | | | OPEN CIRCUIT AT THREE OR MORE TERMINALS | | | | ERROR | ERROR | STOP MODE |

FIG. 16

| DETECTION SIGNAL | | | | | | | | | FAILURE MODE | | | | | | | | MODE SELECTION |
|---|---|---|---|---|---|---|---|---|---|---|---|---|---|---|---|---|---|
| S21 | S22 | S23 | S24 | S25 | S26 | S27 | S28 | PD11 | PD12 | PD13 | PD14 | PD15 | PD16 | PD17 | PD18 | |
| Pass | Pass | Pass | Pass | Pass | Pass | Pass | Pass | — | — | — | — | — | — | — | — | NORMAL MODE |
| Fail | Pass | Pass | Pass | Pass | Pass | Pass | Pass | OPEN CIRCUIT | — | — | — | — | — | — | — | SWITCHING CPUa TO LOW-SPEED MODE |
| Pass | Fail | Pass | Pass | Pass | Pass | Pass | Pass | — | OPEN CIRCUIT | — | — | — | — | — | — | SWITCHING CPUb TO LOW-SPEED MODE |
| Pass | Pass | Fail | Pass | Pass | Pass | Pass | Pass | — | — | OPEN CIRCUIT | — | — | — | — | — | SWITCHING CPUc TO LOW-SPEED MODE |
| Pass | Pass | Pass | Fail | Pass | Pass | Pass | Pass | — | — | — | OPEN CIRCUIT | — | — | — | — | SWITCHING CPUd TO LOW-SPEED MODE |
| Pass | Pass | Pass | Pass | Fail | Pass | Pass | Pass | — | — | — | — | OPEN CIRCUIT | — | — | — | SWITCHING CPUa TO HALT MODE |
| Pass | Pass | Pass | Pass | Pass | Fail | Pass | Pass | — | — | — | — | — | OPEN CIRCUIT | — | — | SWITCHING CPUb TO HALT MODE |
| Pass | Pass | Pass | Pass | Pass | Pass | Fail | Pass | — | — | — | — | — | — | OPEN CIRCUIT | — | SWITCHING CPUc TO HALT MODE |
| Pass | Pass | Pass | Pass | Pass | Pass | Pass | Fail | — | — | — | — | — | — | — | OPEN CIRCUIT | SWITCHING CPUd TO HALT MODE |
| Fail | Pass | Pass | Pass | Pass | Pass | Pass | Pass | OPEN CIRCUIT | — | — | — | — | — | — | — | SWITCHING CPUa TO HALT MODE |
| Pass | Fail | Pass | Pass | Pass | Pass | Pass | Pass | — | OPEN CIRCUIT | — | — | — | — | — | — | SWITCHING CPUb TO HALT MODE |
| Pass | Pass | Fail | Pass | Pass | Pass | Pass | Pass | — | — | OPEN CIRCUIT | — | — | — | — | — | SWITCHING CPUc TO HALT MODE |
| Pass | Pass | Pass | Fail | Pass | Fail | Pass | Pass | — | — | — | OPEN CIRCUIT | — | — | — | — | SWITCHING CPUd TO HALT MODE |
| Pass | Pass | Pass | Pass | Fail | Pass | Fail | Fail | — | — | — | — | OPEN CIRCUIT | — | OPEN CIRCUIT | OPEN CIRCUIT | ABNORMALITY DETECTED, STOP MODE |
| Pass | Pass | Pass | Pass | Pass | Pass | Pass | Pass | OTHER THAN ABOVE | | | | | | | | ABNORMALITY DETECTED, STOP MODE |

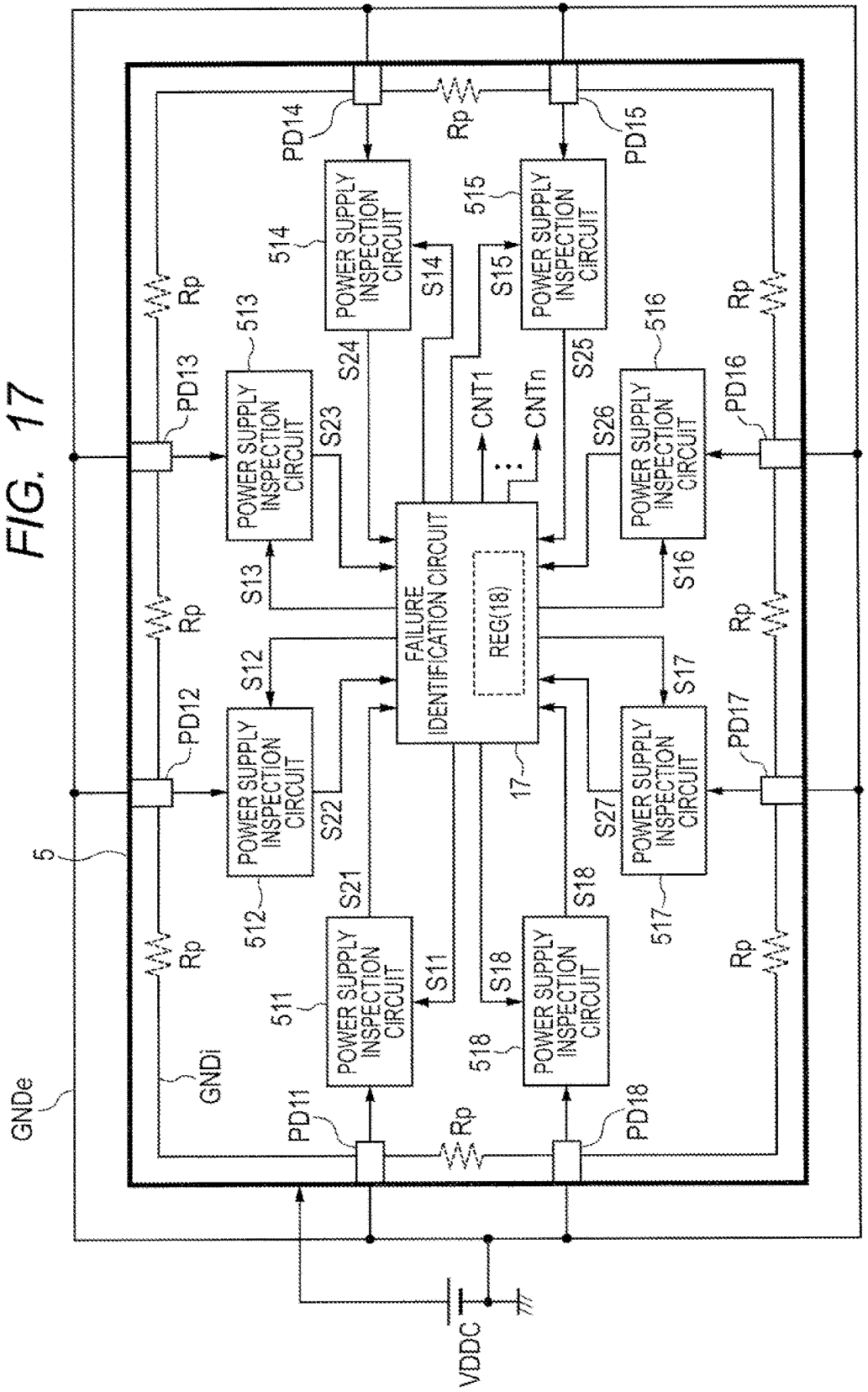

SEMICONDUCTOR DEVICE HAVING CIRCUITRY FOR DETECTING ABNORMALITIES IN A POWER SUPPLY WIRING NETWORK

CROSS-REFERENCE TO RELATED APPLICATIONS

The disclosure of Japanese Patent Application No. 2013-038227 filed on Feb. 28, 2013, including the specification, drawings, and abstract, is incorporated herein by reference in its entirety.

BACKGROUND

The present invention relates to a semiconductor device. More specifically, the present invention relates to a semiconductor device that receives an external power supply voltage from the outside and supplies the external power supply voltage to an internal circuit through, for example, an internally disposed power supply wiring network.

In recent years, it is demanded that a semiconductor device and an electronic system in which a semiconductor device is mounted be highly reliable. If, for example, solder used to mount a semiconductor device on a substrate is defective, the semiconductor device may not properly operate. Therefore, such an electronic system is configured so that a power supply voltage generated by a single power supply is supplied to the semiconductor device through a plurality of terminals of the semiconductor device. This ensures that the semiconductor device operates even when some of the terminals become defective. However, when some of the terminals become defective, different power supply voltages are supplied to the internal elements of the semiconductor device. Therefore, if some of the terminals become defective in a situation where the terminals are used to supply power supply voltage to the semiconductor device, the semiconductor device may malfunction. As such being the case, technologies for detecting the abnormality of a power supply voltage supplied to a semiconductor device are disclosed in Japanese Unexamined Patent Publications No. Hei 09 (1997)-138757, No. 2008-311767, and No. 2006-119777.

The related-art technology disclosed in Japanese Unexamined Patent Publication No. Hei 09 (1997)-138757 selects one of a plurality of subsystems on a periodic basis to let the selected subsystem conduct a boundary-scan test instead of a normal process performed by the selected subsystem while operating the subsystems. Further, this related-art technology checks the operating states of the other subsystems and peripheral circuits in order to identify failures in the subsystems and peripheral circuits.

The related-art technologies disclosed in Japanese Unexamined Patent Publications No. 2008-311767 and No. 2006-119777 control the operating states of circuits in each power supply block by checking each power supply block to detect a decrease in a power supply voltage.

SUMMARY

In short, the related-art technologies disclosed in Japanese Unexamined Patent Publications No. Hei 09 (1997)-138757, No. 2008-311767, and No. 2006-119777 detect a power supply voltage drop in a region where an actually operating circuit (e.g., an internal circuit) is disposed, and control the operating state of the internal circuit. However, even if the related-art technologies are used, the degradation of performance of the internal circuit may be already initiated at a time when the power supply voltage drop is detected. In other words, the above-mentioned related-art technologies cannot detect a power supply voltage abnormality without degrading the performance of the internal circuit. The other problems and novel features will become apparent from the following description and from the accompanying drawings.

According to an aspect of the present invention, there is provided a semiconductor device including a plurality of power supply inspection circuits and a result storage register. The power supply inspection circuits detect a power supply voltage abnormality in each pad that couples an internal wiring disposed in the semiconductor device to another part disposed outside of the semiconductor device. The result storage register stores inspection results indicated by result signals output from the power supply inspection circuits.

Any method and system into which the semiconductor device according to the above-described aspect is embodied and any apparatus having the semiconductor device according to the above-described aspect are also effective as aspects of the present invention.

The above-described aspect of the present invention makes it possible to detect in advance the possibility of a power supply voltage dropping in a region where an internal circuit is disposed.

BRIEF DESCRIPTION OF THE DRAWINGS

FIG. 8 is a table illustrating the failure modes of the semiconductor device according to the first embodiment and semiconductor device operations related to the failure modes;

FIG. 10 is a table illustrating the failure modes of the semiconductor device according to the second embodiment and semiconductor device operations related to the failure modes;

FIG. 16 is a table illustrating the failure modes of the semiconductor device according to the fourth embodiment and semiconductor device operations related to the failure modes;

FIG. 17 is a block diagram illustrating the semiconductor device according to a fifth embodiment of the present invention.

DETAILED DESCRIPTION

Figure 1:
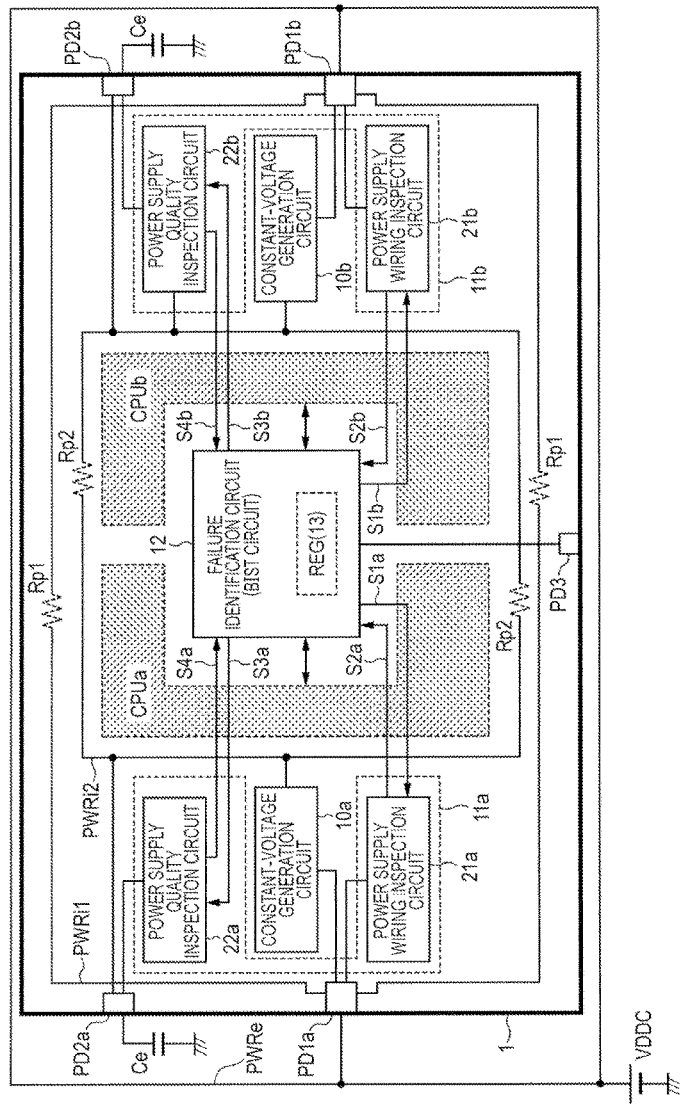
FIG. 1 is a block diagram illustrating a semiconductor device according to a first embodiment of the present invention.

In the following description and drawings, omissions and simplifications are made as needed for the clarification of explanation. Embodiments of the present invention will now be described with reference to the accompanying drawings.
First Embodiment A first embodiment will now be described. FIG. 1 is a block diagram illustrating a semiconductor device 1 according to the first embodiment.

As shown in FIG. 1, the semiconductor device according to the first embodiment includes a plurality of pads, such as pads PD1a, PD1b, PD2a, PD2b, PD3. Each pad couples a power supply wiring network disposed in the semiconductor device 1 to another part coupled to the outside of the semiconductor device 1. In the example shown in FIG. 1, an external power supply voltage is given to the external power pads PD1a, PD1b through an external power supply wiring network PWRe disposed outside of the semiconductor device 1. A smoothing capacitor Ce is coupled to each of the local power pads PD2a, PD2b. The smoothing capacitor Ce is provided to suppress a change in the output voltage of a later-described constant-voltage generation circuit. An external power supply voltage VDDC is given to the external power supply wiring network PWRe from an external power supply disposed outside of the semiconductor device 1.

The semiconductor device 1 further includes internal power supply wiring networks PWRi1, PWRi2, constant-voltage generation circuits 10a, 10b, power supply inspection circuits 11a, 11b, a failure identification circuit 12, and internal circuits CPUa, CPUb. The internal circuits CPUa, CPUb are functional circuits that implement the functionality of the semiconductor device 1. The internal circuits CPUa, CPUb exercise predetermined functions, and perform an arithmetic process and various other processes.

The first internal power supply wiring network PWRi1 is coupled to the external power pad PD1a, PD1b. Further, the first internal power supply wiring network PWRi1 is formed as a loop. The first internal power supply wiring network PWRi1 functions as a first internal power supply wiring network to which the external power supply voltage VDDC generated by the external power supply disposed outside of the semiconductor device 1. In other words, the pads PD1a, PD1b function as first pads that transmit the external power supply voltage to the first internal power supply wiring network. Although FIG. 1 shows only a wiring that forms the outer circumference of the first internal power supply wiring network PWRi1, a grid-like wiring is occasionally provided in the first internal power supply wiring network PWRi1.

The second internal power supply wiring network PWRi2 functions as a second internal power supply wiring network to which an internal power supply voltage generated by the constant-voltage generation circuits 10a, 10b is supplied. Further, the second internal power supply wiring network PWRi2 is formed as a loop. The second internal power supply wiring network PWRi2 is coupled to the local power pads PD2a, PD2b. In other words, the pads PD2a, PD2b function as second pads that couple the second internal power supply wiring network to an externally disposed capacitive element. In the semiconductor device 1 according to the first embodiment, the second internal power supply wiring network PWRi2 supplies a power supply voltage to the internal circuits CPUa, CPUb. Although FIG. 1 shows only a wiring that forms the outer circumference of the second internal power supply wiring network PWRi2, a grid-like wiring is provided in the second internal power supply wiring network PWRi2.

FIG. 1 shows wiring parasitic resistance Rp1 on an outer circumferential wiring of the first internal power supply wiring network PWRi1 and wiring parasitic resistance Rp2 on an outer circumferential wiring of the second internal power supply wiring network PWRi2. The wiring parasitic resistances are parasitic on a wiring that forms the wiring networks. The wiring parasitic resistances cause a voltage drop in the power supply wiring networks.

The constant-voltage generation circuits 10a, 10b generate an internal power supply voltage. The internal power supply voltage is given to the internal circuits CPUa, CPUb and to the failure identification circuit 12 through the second internal power supply wiring network PWRi2. The constant-voltage generation circuit 10a is provided for the pad PD1a. More specifically, the constant-voltage generation circuit 10a is positioned so that its distance from the pad PD1a is shorter than the distance between the pad PD1b and the constant-voltage generation circuit 10b. Further, the constant-voltage generation circuit 10a receives a power supply voltage from a wiring coupled to the pad PD1a. The constant-voltage generation circuit 10b is provided for the pad PD1b. More specifically, the constant-voltage generation circuit 10b is positioned so that its distance from the pad PD1b is shorter than the distance between the pad PD1a and the constant-voltage generation circuit 10b. Further, the constant-voltage generation circuit 10b receives a power supply voltage from a wiring coupled to the pad PD1b.

The power supply inspection circuits 11a, 11b monitor the voltage at an associated one of monitoring points provided for the pads, and check for an abnormality in the power supply wiring networks. The monitoring points are disposed between the pads and a region where the functional circuits are disposed. More specifically, the monitoring points are disposed outside of the region where the functional circuits are disposed. For example, the monitoring points are disposed on a wiring forming the outer circumference of the first internal power supply wiring network PWRi1, on a wiring forming the outer circumference of the second internal power supply wiring network PWRi2, or on a pad. Further, the monitoring points are provided as a contact point between a wiring coupled to the power supply inspection circuits 11a, 11b and a wiring or pad at which the power supply inspection circuits 11a, 11b monitor a voltage.

The power supply inspection circuit 11a is provided for the pads PD1a, PD2a. More specifically, the power supply inspection circuit 11a is positioned so that its distance from the pad PD1a and its distance from the pad PD2a are shorter than the distance between the pad PD1b and the power supply inspection circuit 11b and the distance between the pad PD2b and the power supply inspection circuit 11b. Further, the power supply inspection circuit 11a receives a power supply voltage from a wiring coupled to the pad PD1a.

The power supply inspection circuit 11b is provided for the pads PD1b, PD2b. More specifically, the power supply inspection circuit 11b is positioned so that its distance from the pad PD1b and its distance from the pad PD2b are shorter than the distance between the pad PD1a and the power supply inspection circuit 11b and the distance between the pad PD2a and the power supply inspection circuit 11b. Further, the power supply inspection circuit 11b receives a power supply voltage from a wiring coupled to the pad PD1b.

In the first embodiment, the power supply inspection circuit 11a includes a power supply wiring inspection circuit 21a and a power supply quality inspection circuit 22a, and the power supply inspection circuit 11b includes a power supply wiring inspection circuit 21b and a power supply quality inspection circuit 22b.

The power supply wiring inspection circuits 21a, 21b are provided for the first pads (e.g., pads PD1a, PD1b) to function as a first power supply inspection circuit that detects a first abnormal state when the external power supply voltage VDDC supplied to the pads PD1a, PD1b is lower than a predetermined voltage threshold value. In the example shown in FIG. 1, the power supply wiring inspection circuits 21a, 21b particularly monitor the voltage of the first internal power supply wiring network PWRi1 in the vicinity of the pads PD1a, PD1b. The details of the power supply wiring inspection circuits 21a, 21b will be described later.

The power supply quality inspection circuits 22a, 22b are provided for the second pads (e.g., pads PD2a, PD2b) to function as a second power supply inspection circuit that detects a second abnormal state when the noise of the internal power supply voltage is greater than a predetermined noise threshold value. In the example shown in FIG. 1, the power supply quality inspection circuits 22a, 22b particularly monitor the voltage of the second internal power supply wiring network PWRi2 in the vicinity of the pads PD2a, PD2b. The details of the power supply quality inspection circuits 22a, 22b will be described later.

The failure identification circuit 12 outputs a test signal to the power supply inspection circuits 11a, 11b and acquires a test result related to the test signal. The failure identification circuit 12 includes a result storage register (e.g., an error register 13). In the semiconductor device 1 according to the first embodiment, the failure identification circuit 12 is capable of storing an inspection result in the error register 13 and selecting an appropriate setting for reducing the power consumptions of the functional circuits in accordance with the inspection result. The inspection result stored in the error register 13 is referenced, for instance, by an external device through the output pad PD3. In the example shown in FIG. 1, a BIST (Built In Self Test) circuit is used as the failure identification circuit 12. In the semiconductor device 1 according to the first embodiment, the error register 13 is disposed in the failure identification circuit 12. Alternatively, however, the error register 13 may be independently disposed.

Further, in the example shown in FIG. 1, the failure identification circuit 12 outputs test pulse signals S1a, S1b and test clock signals S3a, S3b as test signals, and receives wiring inspection result signals S2a, S2b and quality inspection result signals S4a, S4b as test results. The test pulse signal S1a is output to the power supply wiring inspection circuit 21a, and the test pulse signal S1b is output to the power supply wiring inspection circuit 21b. The wiring inspection result signal S2a is output from the power supply wiring inspection circuit 21a, and the wiring inspection result signal S2b is output from the power supply wiring inspection circuit 21b. The test clock signal S3a is output to the power supply quality inspection circuit 22a, and the test clock signal S3b is output to the power supply quality inspection circuit 22b. The quality inspection result signal S4a is output from the power supply quality inspection circuit 22a, and the quality inspection result signal S4b is output from the power supply quality inspection circuit 22b.

Moreover, the failure identification circuit 12 references the inspection result stored in the error register 13 and changes the operating states of the internal circuits depending on whether the first or second abnormal state is detected.

Figure 2:
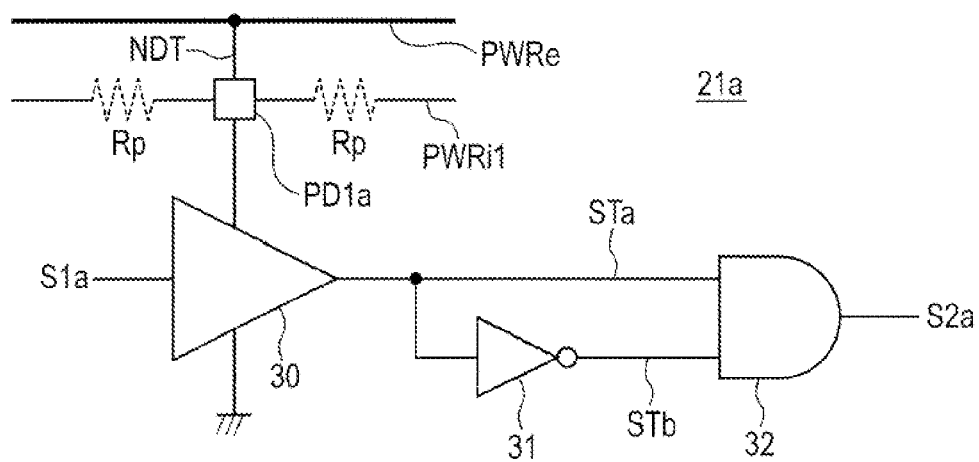
FIG. 2 is a circuit diagram illustrating a power supply wiring inspection circuit of the semiconductor device according to the first embodiment.

The power supply wiring inspection circuits 21a, 21b will now be described in detail. As the power supply wiring inspection circuits 21a, 21b are substantially identical with each other, the description of the power supply wiring inspection circuit 21b will be omitted to describe only the power supply wiring inspection circuit 21a. FIG. 2 is a circuit diagram of the power supply wiring inspection circuit 21a according to the first embodiment.

As shown in FIG. 2, the power supply wiring inspection circuit 21a includes a buffer 30, an inverter 31, and an inverted OR circuit 32. The buffer 30 transmits a received test pulse signal S1a to a subsequent circuit. The buffer 30 operates on the external power supply voltage VDDC supplied to a monitoring point (the pad PD1a in the example shown in FIG. 2) and on a ground voltage.

The inverter 31 inverts an output signal STa of the buffer 30 and transmits the resulting inverted signal to a subsequent circuit. The inverted OR circuit 32 outputs an inverted logical sum of the output signal STa of the buffer 30 and an output signal STb of the inverter 31 as the wiring inspection result signal S2a. The inverter 31 also functions as a delay circuit that gives a delay to the output signal STa of the buffer 30. Although the operating power supplies for the inverter 31 and for the inverted OR circuit 32 are not explicitly indicated in FIG. 2, it is preferred that these circuits also operate on the external power supply voltage VDDC supplied to the pad PD1a and on the ground voltage.

Figure 3:
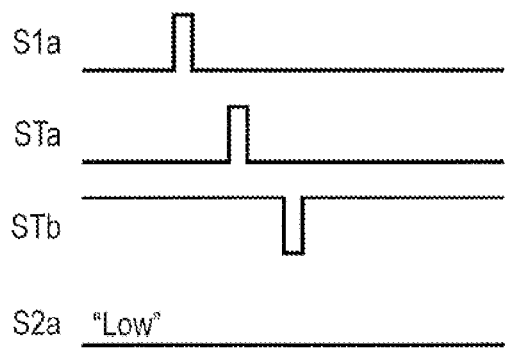
FIG. 3 is a timing diagram illustrating a first operation of the power supply wiring inspection circuit according to the first embodiment.

Operations of the power supply wiring inspection circuit 21a will now be described. FIG. 3 is a timing diagram illustrating an operation that is performed by the power supply wiring inspection circuit 21a when there is no abnormality in the semiconductor device 1 according to the first embodiment (when, for example, no open circuit has occurred in the pad PD1a).

When the semiconductor device 1 is normal, the output signal STa of the buffer 30 is output in response to the test pulse signal S1a as shown in FIG. 3. The inverter 31 outputs the output signal STb that is delayed from the output signal STa of the buffer 30 and has an inverted logic level with respect to the output signal STa of the buffer 30. In this instance, the pulse signal of the output signal STa and the pulse signal of the output signal STb are output at such a timing that their pulse portions do not overlap in time with each other due to the delay provided by the inverter 31. Therefore, the wiring inspection result signal S2a output from the inverted OR circuit 32 remains low.

Figure 4:
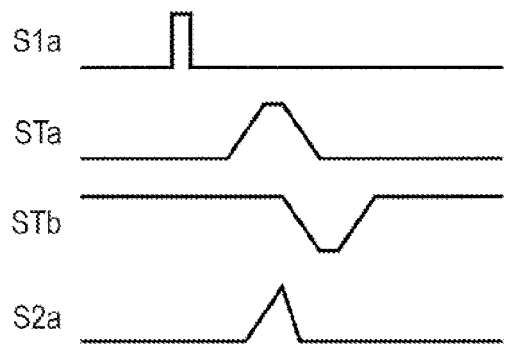
FIG. 4 is a timing diagram illustrating a second operation of the power supply wiring inspection circuit according to the first embodiment.

Meanwhile, FIG. 4 is a timing diagram illustrating an operation that is performed by the power supply wiring inspection circuit 21a when there is an abnormality in the semiconductor device 1 according to the first embodiment (when, for example, an open circuit has occurred in the pad PD1a).

If an open circuit has occurred in the pad PD1a of the semiconductor device 1, a voltage drop is caused by the wiring parasitic resistance Rp1 in the first internal power supply wiring network PWRi1 as shown in FIG. 4 although the pad PD1b supplies electrical power to the buffer 30 of the power supply wiring inspection circuit 21a. Therefore, the power supply voltage supplied to the buffer 30 of the power supply wiring inspection circuit 21a is lower than when no open circuit has occurred in the pad PD1a. Hence, when an open circuit has occurred in the pad PD1a, the drive capability of the buffer 20 decreases to reduce the gradient of the rise and fall of the output signal STa output from the buffer 30.

As the above change occurs, when an open circuit has occurred in the pad PD1a, a period during which the signal level of the output signal STa of the buffer 30 is high overlaps with a period during which the signal level of the output signal STb of the inverter 31 remains high, as shown in FIG. 4. Hence, when an open circuit has occurred in the pad PD1a, the wiring inspection result signal S2a output from the inverted OR circuit 32 is a pulse signal, that is, a signal that is high during a period during which the output signals STa, STb are both determined to be high. In accordance with a pulse of the wiring inspection result signal S2a, the failure identification circuit 12 concludes that an open circuit has occurred in the pad PD1a.

Figure 5:
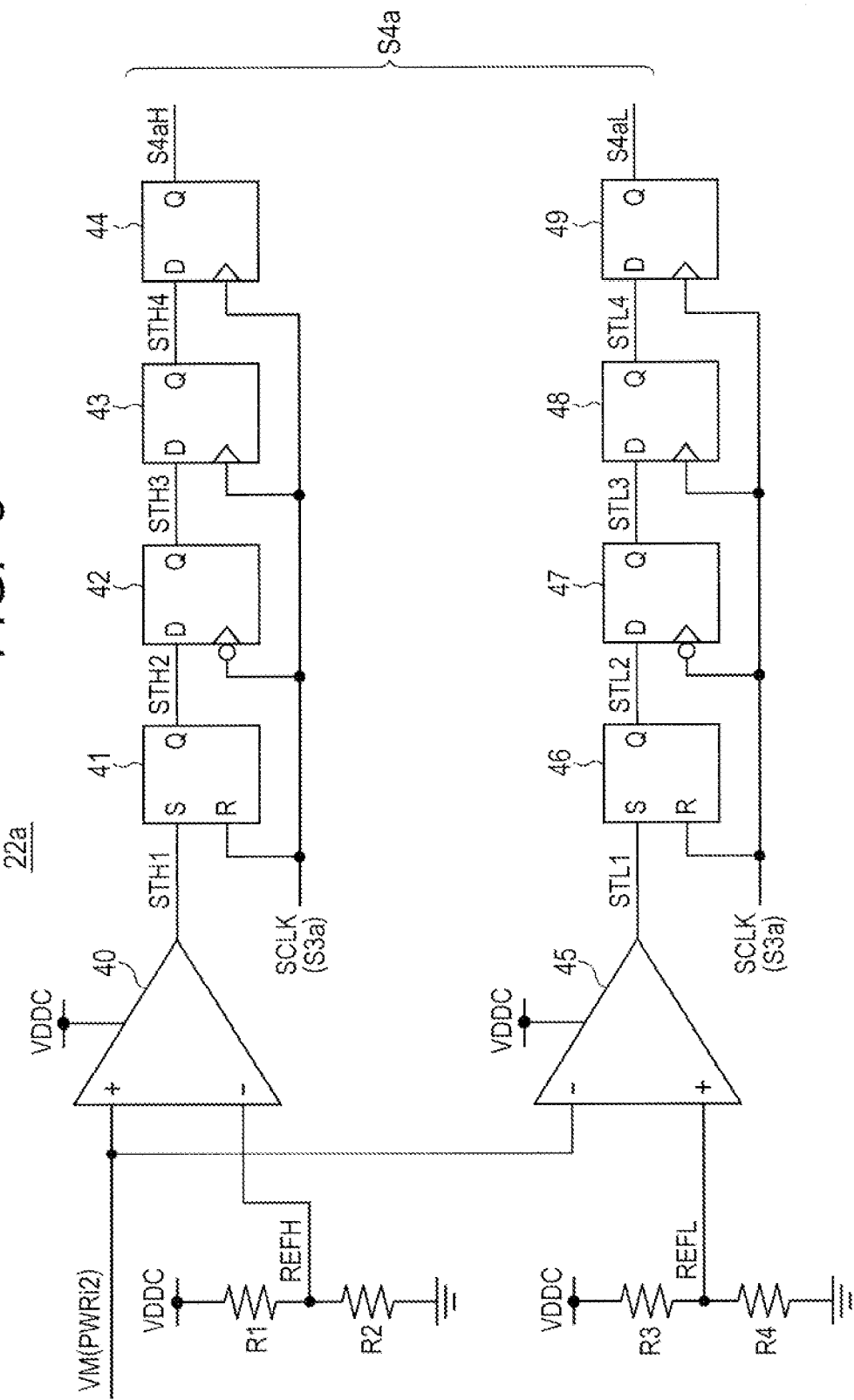
FIG. 5 is a circuit diagram illustrating a power supply quality inspection circuit of the semiconductor device according to the first embodiment.

The power supply quality inspection circuits 22a, 22b will now be described in detail. As the power supply quality inspection circuits 22a, 22b are substantially identical with each other, the description of the power supply quality inspection circuit 22b will be omitted to describe only the power supply quality inspection circuit 22a. FIG. 5 is a circuit diagram of the power supply quality inspection circuit 22a according to the first embodiment.

As shown in FIG. 5, the power supply quality inspection circuit 22a includes resistors R1-R4, comparators 40, 45, SR latch circuits 41, 46, and flip-flop circuits 42-44, 47-49. The power supply quality inspection circuit 22a operates on the external power supply voltage VDDC supplied to a monitoring point (the pad PD1a in the example shown in FIG. 2) or to the first internal power supply wiring network PWRi1 and on the ground voltage. The quality inspection result signal S4a includes a high-potential result signal S4aH and a low-potential result signal S4aL as shown in FIG. 5.

The resistors R1, R2 are series-coupled between the first internal power supply wiring network PWRi1 to which the external power supply voltage VDDC is supplied and a ground wiring to which the ground voltage is supplied. The resistors R1, R2 form a first voltage divider and output a high-potential reference voltage REFH from a contact point to which the resistors R1, R2 are coupled.

The comparator 40 has a non-inverting input terminal, an inverting input terminal, and an output terminal. The comparator 40 is configured so that the high-potential reference voltage REFH is input to the inverting input terminal, and that a monitored voltage VM at a monitoring point (e.g., an input power supply voltage that is supplied to the second internal power supply wiring network PWRi2 and in the vicinity of the pad PD2a) is input to the non-inverting input terminal. The comparator 40 changes the logic level of its output signal STH1 in accordance with the magnitude relationship between the high-potential reference voltage REFH and the voltage monitored VM at a monitoring point. For example, the comparator 40 operates so that its output signal STH1 is high when the monitored voltage VM is not lower than the high-potential reference voltage REFH and low when the monitored voltage VM is lower than the high-potential reference voltage REFH.

The SR latch circuit 41 has a set terminal S, a reset terminal R, and an output terminal Q. The SR latch circuit 41 is configured so that the output signal STH1 of the comparator 40 is input to the set terminal S, and that the test clock signal S3a is input to the reset terminal R. The SR latch circuit 41 operates so that its output signal STH2 is high at the rising edge of the output signal STH1 and low at the rising edge of the test clock signal S3a.

The flip-flop circuit 42 has a data input terminal D, a clock input terminal, and an output terminal Q. The flip-flop circuit 42 is configured so that the output signal STH2 of the SR latch circuit 41 is input to the data input terminal D, and that the test clock signal S3a is input to the clock input terminal. The flip-flop circuit 42 determines the signal level of the output signal STH2 input to its data input terminal D at the falling edge of the test clock signal S3a, and changes the signal level of an output signal STH3 in accordance with the determined signal level of the output signal STH2.

The flip-flop circuit 43 has a data input terminal D, a clock input terminal, and an output terminal Q. The flip-flop circuit 43 is configured so that the output signal STH3 of the flip-flop circuit 42 is input to the data input terminal D, and that the test clock signal S3a is input to the clock input terminal. The flip-flop circuit 43 determines the signal level of the output signal STH3 input to its data input terminal D at the rising edge of the test clock signal S3a, and changes the signal level of an output signal STH4 in accordance with the determined signal level of the output signal STH3.

The flip-flop circuit 44 has a data input terminal D, a clock input terminal, and an output terminal Q. The flip-flop circuit 44 is configured so that the output signal STH4 of the flip-flop circuit 43 is input to the data input terminal D, and that the test clock signal S3a is input to the clock input terminal. The flip-flop circuit 44 determines the signal level of the output signal STH4 input to its data input terminal D at the rising edge of the test clock signal S3a, and changes the signal level of the high-potential result signal S4aH in accordance with the determined signal level of the output signal STH4.

The resistors R3, R4 are series-coupled between the first internal power supply wiring network PWRi1 to which the external power supply voltage VDDC is supplied and the ground wiring to which the ground voltage is supplied. The resistors R3, R4 form a second voltage divider and output a low-potential reference voltage REFL from a contact point to which the resistors R3, R4 are coupled.

The comparator 45 has a non-inverting input terminal, an inverting input terminal, and an output terminal. The comparator 45 is configured so that the low-potential reference voltage REFL is input to the non-inverting input terminal, and that the monitored voltage VM at a monitoring point (e.g., an input power supply voltage that is supplied to the second internal power supply wiring network PWRi2 and in the vicinity of the pad PD2a) is input to the inverting input terminal. The comparator 45 changes the logic level of its output signal STL1 in accordance with the magnitude relationship between the low-potential reference voltage REFL and the monitored voltage VM. For example, the comparator 45 operates so that its output signal STL1 is high when the monitored voltage VM is not higher than the low-potential reference voltage REFL and low when the monitored voltage VM is higher than the low-potential reference voltage REFL.

The SR latch circuit 46 has a set terminal S, a reset terminal R, and an output terminal Q. The SR latch circuit 46 is configured so that the output signal STL1 of the comparator 45 is input to the set terminal S, and that the test clock signal S3a is input to the reset terminal R. The SR latch circuit 46 operates so that its output signal STL2 is high at the rising edge of the output signal STL1 and low at the rising edge of the test clock signal S3a.

The flip-flop circuit 47 has a data input terminal D, a clock input terminal, and an output terminal Q. The flip-flop circuit 47 is configured so that the output signal STL2 of the SR latch circuit 46 is input to the data input terminal D, and that the test clock signal S3a is input to the clock input terminal. The flip-flop circuit 47 determines the signal level of the output signal STL2 input to its data input terminal D at the falling edge of the test clock signal S3a, and changes the signal level of an output signal STL3 in accordance with the determined signal level of the output signal STL2.

The flip-flop circuit 48 has a data input terminal D, a clock input terminal, and an output terminal Q. The flip-flop circuit 48 is configured so that the output signal STL3 of the flip-flop circuit 47 is input to the data input terminal D, and that the test clock signal S3a is input to the clock input terminal. The flip-flop circuit 48 determines the signal level of the output signal STL3 input to its data input terminal D at the rising edge of the test clock signal S3a, and changes the signal level of an output signal STL4 in accordance with the determined signal level of the output signal STL3.

The flip-flop circuit 49 has a data input terminal D, a clock input terminal, and an output terminal Q. The flip-flop circuit 49 is configured so that the output signal STL4 of the flip-flop circuit 48 is input to the data input terminal D, and that the test clock signal S3a is input to the clock input terminal. The flip-flop circuit 49 determines the signal level of the output signal STL4 input to its data input terminal D at the rising edge of the test clock signal S3a, and changes the signal level of the low-potential result signal S4aL in accordance with the determined signal level of the output signal STL4.

Figure 6:
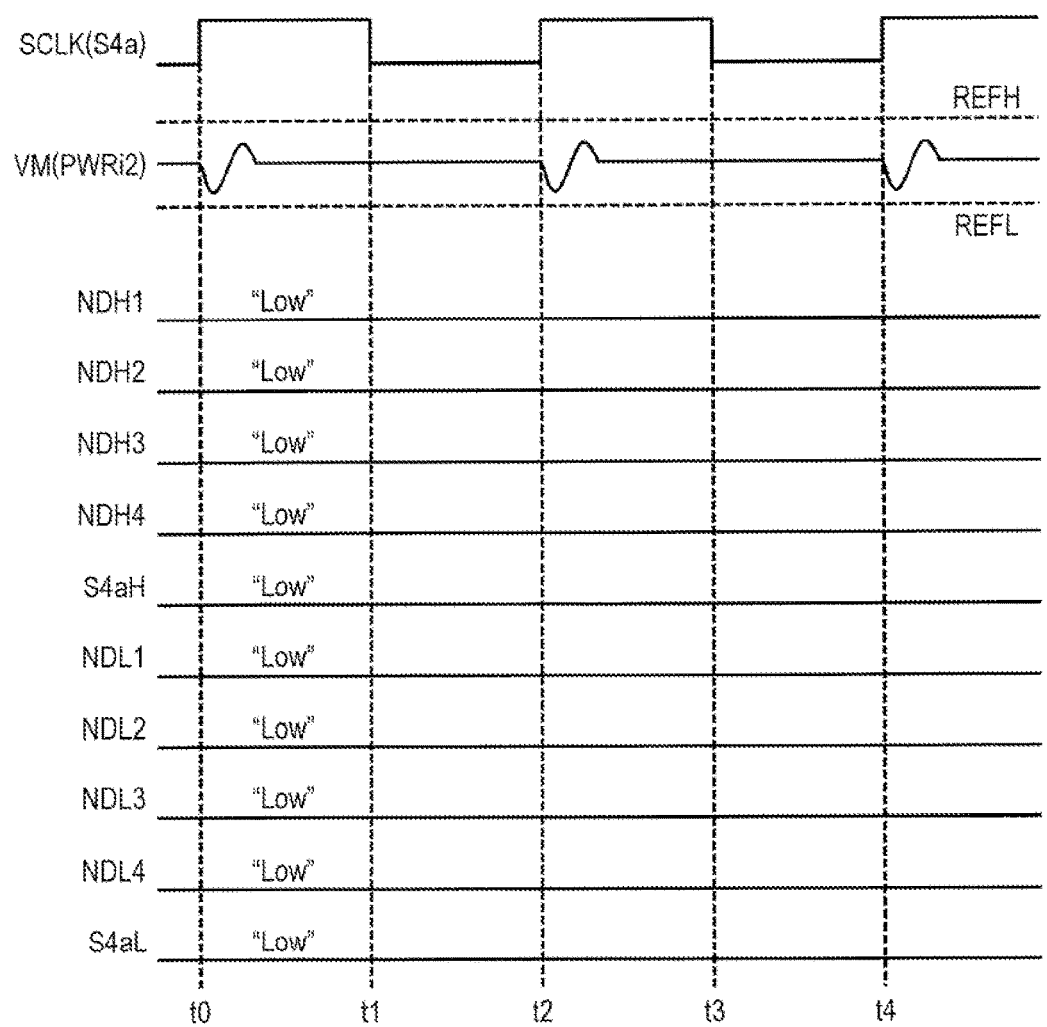
FIG. 6 is a timing diagram illustrating a first operation of the power supply quality inspection circuit according to the first embodiment.

Operations of the power supply quality inspection circuit 22a will now be described. FIG. 6 is a timing diagram illustrating an operation that is performed by the power supply quality inspection circuit 22a when there is no abnormality in the semiconductor device 1 according to the first embodiment (when, for example, no open circuit has occurred in the pad PD2a).

First of all, a logic level change occurs in the internal circuits of the semiconductor device 1 at each rising edge of the test clock signal S3a (e.g., at timing t0, at timing t2, and at timing t4). Further, the internal power supply voltage (e.g., monitored voltage VM) changes at each rising edge of the test clock signal S3a. In the example shown in FIG. 6, therefore, the monitored voltage VM changes at the rising edge of the test clock signal S3a.

When the semiconductor device 1 is normal, the monitored voltage VM changes. However, such a voltage change is within a range between the high-potential reference voltage REFH and the low-potential reference voltage REFL. Therefore, when the semiconductor device 1 is normal, the output signals STH1, STL1 of the comparators 40, 44 remain low. As the output signals STH1, STL1 remain low, the output signals STH2-STH4, STL2-STL4, the high-potential result signal S4aH, and the low-potential result signal S4aL also remain low.

Figure 7:
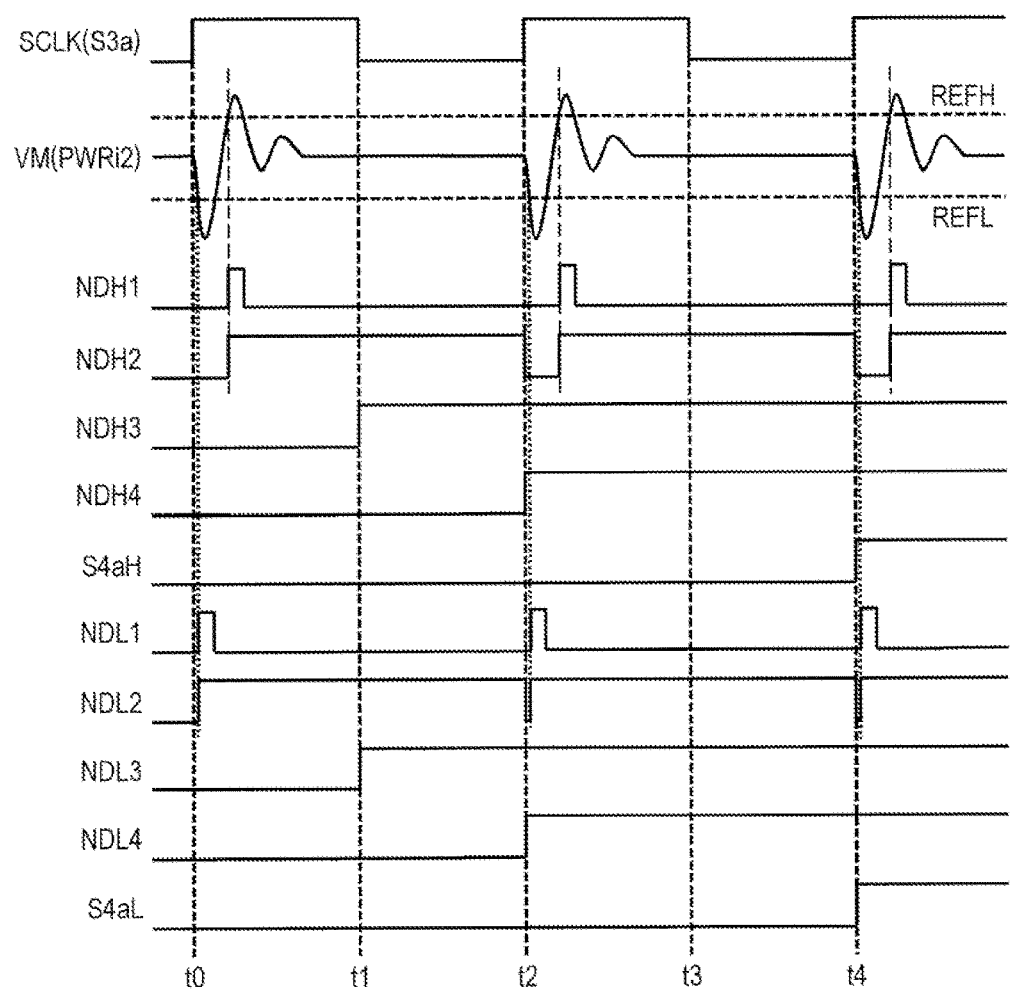
FIG. 7 is a timing diagram illustrating a second operation of the power supply quality inspection circuit according to the first embodiment.

Meanwhile, FIG. 7 is a timing diagram illustrating an operation that is performed by the power supply quality inspection circuit 22a when there is an abnormality in the semiconductor device 1 according to the first embodiment (when, for example, an open circuit has occurred in the pad PD2a).

As shown in FIG. 7, when an open circuit has occurred in the pad PD2a of the semiconductor device 1, the extent of a change in the monitored voltage VM at the rising edge of the test clock signal S3a is greater than when no open circuit has occurred in the pad PD2a. More specifically, in the example shown in FIG. 7, the extent of a change in the monitored voltage VM is outside a permissible range of noise that is defined by the high-potential reference voltage REFH and low-potential reference voltage REFL.

Hence, a pulse is generated in the output signal STH1 of the comparator 40 and in the output signal STH2 of the comparator 45 during a noise generation period after timing t0, timing t2, and timing t4 at which the rising edge of the test clock signal S3a is input. Further, the output signals STH2, STL2 of the SR latch circuits 41, 46 go high at the rising edge of the pulses in the output signals STH1, STL1. Furthermore, the flip-flop circuits 42, 47 change the logic levels of the output signals STH3, STL3 in accordance with the logic levels of the output signals STH2, STL2 at timing t1 and timing t3 at which the falling edge of the test clock signal S3a is input. Subsequently, each time the rising edge of the test clock signal S3a is input, the flip-flop circuits 44, 45 and the flip-flop circuits 48, 49 change the logic levels of their output signals in accordance with the logic level of the output signal of a preceding circuit.

As the above changes occur, if an open circuit has occurred in the pad PD2a, the high-potential result signal S4aH and the low-potential result signal S4aL go high in accordance with a frequency at which noise beyond the permissible range is generated in the monitored voltage VM, as shown in FIG. 7. Hence, in accordance with the frequency at which the quality inspection result signal S4a goes high, the failure identification circuit 12 concludes that an open circuit has occurred in the pad PD2a. Whether or not the failure identification circuit 12 concludes that an open circuit has occurred in the pad PD2a is determined by defining a threshold value indicative of the number of times the quality inspection result signal S4a goes high during a predetermined period and by checking whether the threshold value is exceeded.

As described above, the semiconductor device 1 according to the first embodiment is configured so that each power supply inspection circuit 11a, 11b includes a plurality of different inspection circuits for detecting voltage changes, namely a power supply wiring inspection circuit 21a, 21b and a power supply quality inspection circuit 22a, 22b. Further, the semiconductor device 1 according to the first embodiment is configured so that the failure identification circuit 12 receives a signal indicative of a measurement result individually from each of the power supply wiring inspection circuits 21a, 21b and the power supply quality inspection circuits 22a, 22b and determines an open circuit in the associated pad. Hence, the semiconductor device 1 according to the first embodiment can determine whether an open circuit has occurred in the pad PD1a, in the pad PD1b, in the pad PD2a, or in the pad PD2b. Thus, in the semiconductor device 1 according to the first embodiment, the failure identification circuit 12 controls the operating states of the internal circuits in accordance with the cause of the failure. FIG. 8 is a table illustrating the failure modes of the semiconductor device 1 according to the first embodiment and semiconductor device operations related to the failure modes.

As shown in FIG. 8, if the wiring inspection result signals S2a, S2b and the quality inspection result signals S4a, S4b are all "Pass" to indicate that there is no failure (Case 1), the failure identification circuit 12 allows the internal circuits to operate in a normal mode in which no operating limitations are imposed. If either the wiring inspection result signal S2a or the wiring inspection result signal S2b is "Fail" to indicate that an open circuit has occurred (Case 2 or 3), the failure identification circuit 12 operates the internal circuits in a low-speed mode in which the frequencies of their operating clocks are decreased, and then stores a value indicative of a warning in the error register 13. If either the quality inspection result signal S4a or the quality inspection result signal S4b is "Fail" to indicate that an open circuit has occurred (Case 4 or 5), the failure identification circuit 12 places the internal circuits in a stop mode to stop the internal circuits, and then stores a value indicative of an error in the error register 13. If the wiring inspection result signals S2a, S2b and the quality inspection result signals S4a, S4b are other than indicated above (Case 6), the failure identification circuit 12 places the internal circuits in the stop mode to stop the internal circuits, and then stores a value indicative of an error in the error register 13.

As described above, the semiconductor device 1 according to the first embodiment includes the power supply inspection circuits 11, which detect a voltage abnormality in the vicinity of the pads coupled to the internal power supply wiring networks PWRi1, PWRi2. Hence, the semiconductor device 1 according to the first embodiment can detect an open circuit related to a pad before the power supply voltage drops in a region where the internal circuits are disposed, namely, in a region where the power supply voltage is supplied through a mesh wiring coupled to the internal power supply wiring networks PWRi1, PWRi2.

Further, the semiconductor device 1 according to the first embodiment detects a voltage abnormality in an outer circumferential wiring or at a coupling point between the outer circumferential wiring and a pad. This enables the semiconductor device 1 to detect an open circuit related to a pad without using the processing capacity of the internal circuits. In other words, the semiconductor device 1 according to the first embodiment can detect an open circuit related to a pad (e.g., an open circuit in a wiring between a pad and a frame or an imperfect solder joint between an external terminal of the semiconductor device and a substrate on which the semiconductor device is mounted) without degrading the performance of the internal circuits, which implement the functionality of the semiconductor device 1.

Furthermore, the semiconductor device 1 according to the first embodiment is configured so that the failure identification circuit 12 can control the operating states of the internal circuits in multiple steps in accordance with the result of inspection by the power supply inspection circuits 11. Therefore, if the internal circuits are operative with a minimum of limitations imposed, the semiconductor device 1 according to the first embodiment can stop after performing an error process with the processing capacity of the internal circuits slightly reduced or after performing a warning or other similar process. By performing such a process, the semiconductor device 1 according to the first embodiment can increase the number of stop process variations.

Moreover, the semiconductor device 1 according to the first embodiment includes the power supply quality inspection circuits 22a, 22b. This makes it possible to detect not only an open circuit between the external power supply wiring network PWRe and the pads PD1a, PD1b, but also an open circuit between the pads PD2a, PD2b and the smoothing capacitor Ce. If the smoothing capacitor Ce is uncoupled due to an open circuit in a situation where the internal power supply voltage is generated by the constant-voltage generation circuits 10a, 10b, the internal power supply voltage may intermittently decrease with the logic levels of the internal circuits frequently changed to cause the internal circuits to malfunction even when the internal power supply voltage is determined to be normal while the logic levels of the internal circuits are infrequently changed by a clock signal. However, when only the DC voltages of the internal power supply wiring networks PWRi1, PWRi2 are monitored, it is impossible to prevent the internal circuits from malfunctioning due to noise superimposed on such voltages. In other words, the semiconductor device 1 according to the first embodiment can avoid a malfunction due to such voltage noise because it includes the power supply quality inspection circuits 22a, 22b.

Second Embodiment

Figure 9:
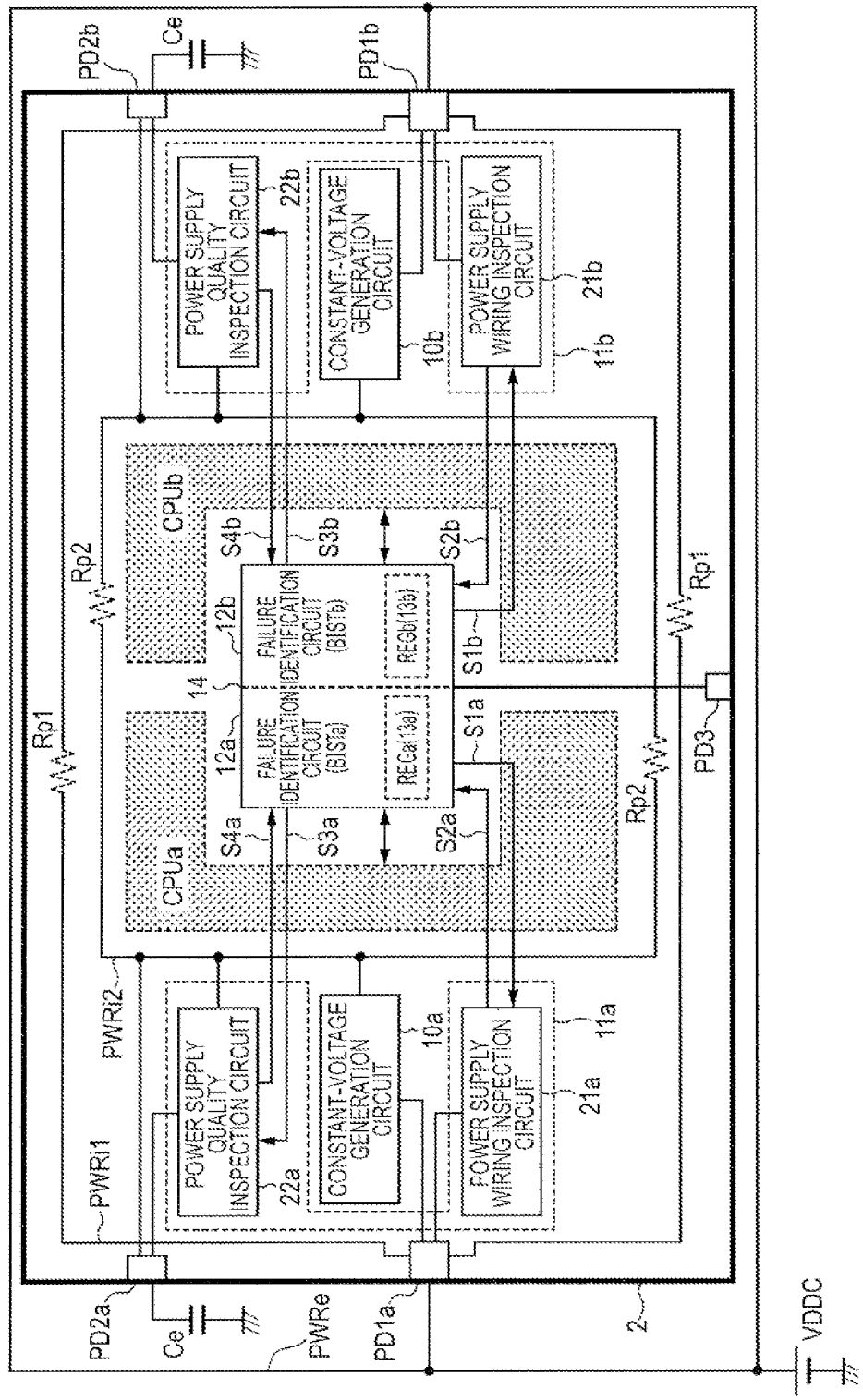
FIG. 9 is a block diagram illustrating the semiconductor device according to a second embodiment of the present invention.

A second embodiment of the present invention will now be described in relation to a semiconductor device 2 that differs in configuration from the semiconductor device 1 according to the first embodiment. FIG. 9 is a block diagram illustrating the semiconductor device 2 according to the second embodiment. As shown in FIG. 9, the semiconductor device 2 according to the second embodiment includes a failure identification circuit 14 in place of the failure identification circuit 12. As regards the description of the semiconductor device 2 according to the second embodiment, elements identical with those described in conjunction with the first embodiment are designated by the same reference numerals as the corresponding elements of the first embodiment and will not be redundantly described.

The failure identification circuit 14 includes a plurality of failure identification sub-circuits that individually control the power supply inspection circuits. More specifically, the failure identification circuit 14 includes first and second failure identification sub-circuits 12a, 12b. The first failure identification sub-circuit 12a not only controls the power supply inspection circuit 11a, but also conducts a self-diagnostic test on the internal circuit CPUa. The second failure identification sub-circuit 12b not only controls the power supply inspection circuit 11b, but also conducts a self-diagnostic test on the internal circuit CPUb.

The first failure identification sub-circuit 12a includes a first error register 13a. The second failure identification sub-circuit 12b includes a second error register 13b. The error registers 13a, 13b respectively store an inspection result derived from the associated power supply inspection circuit. The inspection results stored in the corresponding first and second error registers 13a, 13b are referenced, for instance, by the other devices disposed outside of the semiconductor device 2 through the output pad PD3. Further, the failure identification sub-circuits 12a, 12b change the operating states of the internal circuits CPUa, CPUb in accordance with the inspection results stored in the error registers 13a, 13b.

Operations of the semiconductor device 2 according to the second embodiment will now be described. FIG. 10 is a table illustrating the failure modes of the semiconductor device according to the second embodiment and semiconductor device operations related to the failure modes.

As shown in FIG. 10, the failure identification circuit 14 according to the second embodiment first conducts self-diagnostic tests by using its two failure identification sub-circuits, namely, the failure identification sub-circuits 12a, 12b (e.g., Cases 1, 2, 3, 4, and 6). The self-diagnostic tests indicated in Cases 1 to 4 and 6 are not described here because they correlate to those indicated in Cases 1 to 5 shown in FIG. 8.

Meanwhile, the use of the failure identification circuit 14 permits the following determinations to be made in addition to Cases 1 to 4 and 6 above. More specifically, a situation where an open circuit is simultaneously formed at two terminals can be determined from test results.

If, for instance, an open circuit occurs in the pads PD1a, PD2a simultaneously as indicated in Case 51, an error representing a serious failure is stored in the first error register 13a so that the inspection results stored in the error registers 13a, 13b are the same as in Case 4. It means that the failure cannot be located. As such being the case, the self-diagnostic tests indicated in Cases 52 and 53 are conducted to determine whether the state of the error corresponds to Case 4 or Case 51.

In Case 52, only the second failure identification sub-circuit 12b is operated. In Case 52, the wiring inspection result signal S2b and the quality inspection result signal S4b are both "Pass" because the pad PD1b and the pad PD2b are normal. In Case 52, therefore, the error register 13b stores "OK", which represents a normal value.

In Case 53, on the other hand, only the first failure identification sub-circuit 12a is operated. In Case 53, the power supply voltage for the internal circuit CPUa, the power supply inspection circuit 11a, and the first failure identification sub-circuit 12a is supplied from the pads PD1b, PD2b. Further, as the internal circuit CPUb, the power supply inspection circuit 11b, and the second failure identification sub-circuit 12b are stopped in Case 53, the power consumption is lower than in Case 51. In Case 53, therefore, the noise of the voltage in the second internal power supply wiring network PWRi2 is smaller than in Case 51. Furthermore, as the pad PD1b supplies the power supply voltage for the pad PD1a, which is monitored by the power supply wiring inspection circuit 21a of the power supply inspection circuit 11a, the voltage at the pad PD1a is lower than the voltage at the pad PD1b. Consequently, in Case 53, the wiring inspection result signal S2a is "Fail" to indicate a voltage drop, and the quality inspection result signal S4a is "Pass" to indicate that the noise of the monitored voltage VM is within the permissible range. Hence, in Case 53, the first error register 13a stores a value indicative of a warning.

In other words, when Cases 52 and 53 are executed in a situation where the failure identification circuit 14 is used to store an error in the first error register 13a and "OK" in the second error register 13b, it is possible to determine whether the state in Case 51 or the state in Case 4 prevails, that is, whether an open circuit has occurred in both the pad PD1a and the pad PD2a or in the pad PD2a only.

As regards Case 6 in which an open circuit has occurred in the pad PD2b and Case 71 in which an open circuit has occurred in both the pad PD1b and the pad PD2b, the open circuit can be located similarly by conducting the tests indicated in Cases 72 and 73 in which the first failure identification sub-circuit 12a and the second failure identification a second circuit 12b are respectively operated.

As described above, the semiconductor device 2 according to the second embodiment includes the first and second failure identification sub-circuits 12a, 12b, which are independently controllable. Therefore, the semiconductor device 2 according to the second embodiment can locate a failure more precisely than the semiconductor device 1 according to the first embodiment. As the semiconductor device 2 according to the second embodiment locates a failure precisely, it makes it possible to locate an imperfect solder joint with increased promptness and repair or recover a system without a delay.

Third Embodiment

Figure 11:
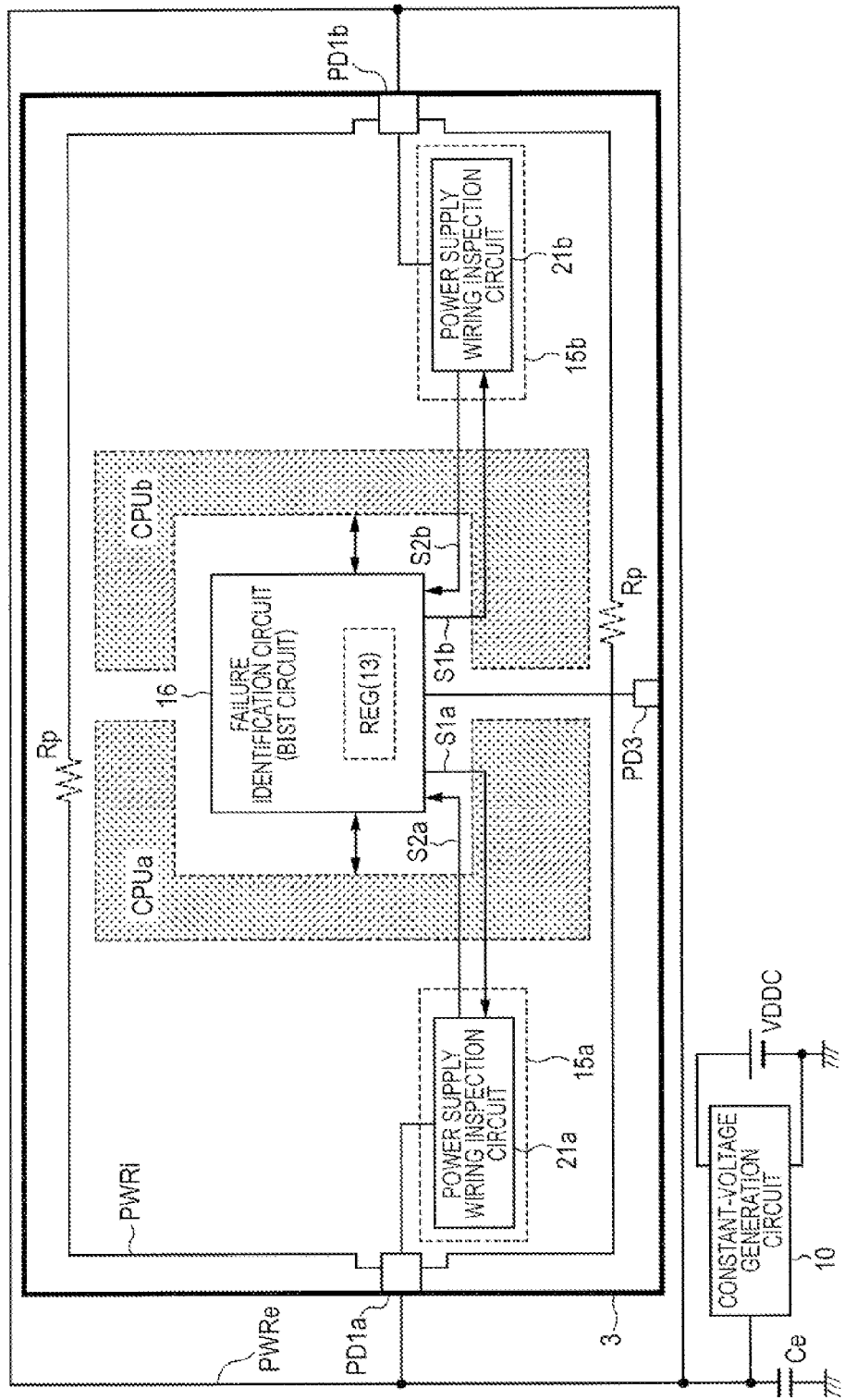
FIG. 11 is a block diagram illustrating the semiconductor device according to a third embodiment of the present invention.

A third embodiment of the present invention will now be described in relation to a semiconductor device 3 that differs in configuration from the semiconductor device 1 according to the first embodiment. FIG. 11 is a block diagram illustrating the semiconductor device 3 according to the third embodiment. As shown in FIG. 11, the semiconductor device 3 according to the third embodiment is configured so that the constant-voltage generation circuits 10a, 10b are disposed as an external part. In the semiconductor device 3 shown in FIG. 11, therefore, the power supply voltage generated by an externally disposed ("off-chip") constant-voltage generation circuit 10 is supplied to the external power supply wiring network PWRe. The power supply voltage supplied to the external power supply wiring network PWRe is further supplied as an internal power supply voltage to an internal power supply wiring network PWRi through the external power pads PD1a, PD1b.

The semiconductor device 3 according to the third embodiment includes power supply inspection circuits 15a, 15b and a failure identification circuit 16 in place of the power supply inspection circuits 11a, 11b and the failure identification circuit 12. As regards the description of the semiconductor device 3 according to the third embodiment, elements identical with those described in conjunction with the first embodiment are designated by the same reference numerals as the corresponding elements of the first embodiment and will not be redundantly described.

The power supply inspection circuits 15a, 15b are obtained by eliminating the power supply quality inspection circuits 22a, 22b from the power supply inspection circuits 11a, 11b, respectively. More specifically, the power supply inspection circuit 15a has only the power supply wiring inspection circuit 21a, and the power supply inspection circuit 15b has only the power supply wiring inspection circuit 21b.

In other words, the semiconductor device 3 according to the third embodiment is configured so that the operating power supply voltage for the internal circuits of the semiconductor device is directly supplied from the outside of the semiconductor device. In this instance, the terminal for coupling the smoothing capacitor Ce is omitted. Therefore, it is necessary to include at least the power supply wiring inspection circuits 21a, 21b that check for an open circuit in the pads PD1a, PD1b, which receive the power supply voltage from the outside.

The above-described configuration makes it possible to use an off-chip constant-voltage generation circuit 10 having an improved current supply capacity and adopt internal circuits having a higher functionality for the semiconductor device 3. Further, as the power supply wiring inspection circuits 21a, 21b are disposed in the semiconductor device 3, the pads PD1a, PD1b can be checked for an open circuit without using the capabilities of the internal circuits.

Fourth Embodiment

Figure 12:
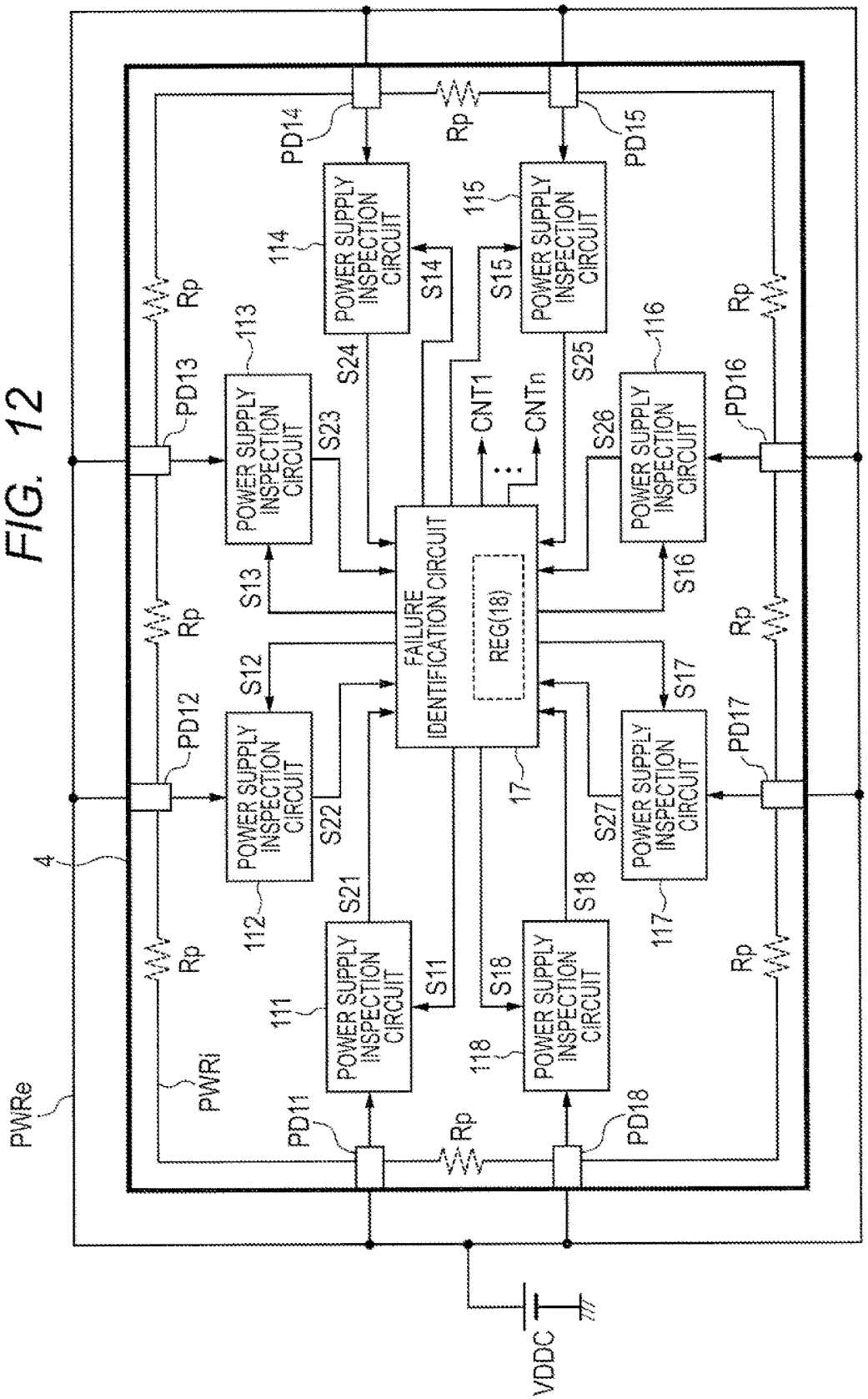
FIG. 12 is a block diagram illustrating the semiconductor device according to a fourth embodiment of the present invention.

A fourth embodiment of the present invention will now be described in relation to a semiconductor device 4 that has a greater number of pads than the semiconductor device 1 according to the first embodiment. FIG. 12 is a block diagram illustrating the semiconductor device 4 according to the fourth embodiment. As regards the description of the fourth embodiment, elements identical with those described in conjunction with the foregoing embodiments are designated by the same reference numerals as the corresponding elements of the foregoing embodiments and will not be redundantly described.

As shown in FIG. 12, the semiconductor device 4 according to the fourth embodiment includes pads PD11-PD18. The semiconductor device 4 is configured so that the pads PD11-PD18 receive the external power supply voltage VDDC, which is given to the external power supply wiring network PWRe disposed outside of the semiconductor device 4, as an internal power supply voltage. In the semiconductor device 4, therefore, the same voltage is given to the pads PD11-PD18.

The semiconductor device 4 according to the fourth embodiment includes a plurality of power supply inspection circuits 111-118, a failure identification circuit 17, an internal power supply wiring network PWRi, and a plurality of internal circuits (not shown). The internal power supply wiring network PWRi receives the external power supply voltage from the pads PD11-PD18 and gives the received external power supply voltage to the internal circuits (not shown) as the internal power supply voltage. Although FIG. 12 shows only the outer circumferential wiring of the internal power supply wiring network PWRi, a grid-like wiring is disposed in the depicted internal power supply wiring network PWRi.

The power supply inspection circuits 111-118 each include a power supply wiring inspection circuit that detects an abnormal state if the voltage in the vicinity of an associated pad (e.g., the voltage in the vicinity of the pads PD11-PD18) is lower than a predetermined voltage threshold value. In other words, the power supply inspection circuits 111-118 each include the power supply wiring inspection circuit 21a shown in FIG. 1 or 2.

The failure identification circuit 17 gives test pulse signals S 11-S 18 to the power supply inspection circuits 111-118 and receives wiring inspection result signals S21-S28 output from the power supply inspection circuits 111-118.

Further, the failure identification circuit 17 includes an error register 18 and stores inspection results derived from the wiring inspection result signals S21-S28 in the error register 18. In accordance with the inspection results stored in the error register 18, the failure identification circuit 17 controls the power consumption of the internal circuits. The fourth embodiment, in particular, includes the internal circuits whose power consumption can be individually controlled. In accordance with the inspection results stored in the error register 18, the failure identification circuit 17 selects a low power consumption setting for one of the functional circuits (e.g., internal circuits) that is positioned close to a monitoring point (e.g., a contact point at which an inspection target voltage is acquired by the power supply inspection circuits 111-118) associated with a power supply inspection circuit that has detected an abnormal state.

Figure 13:
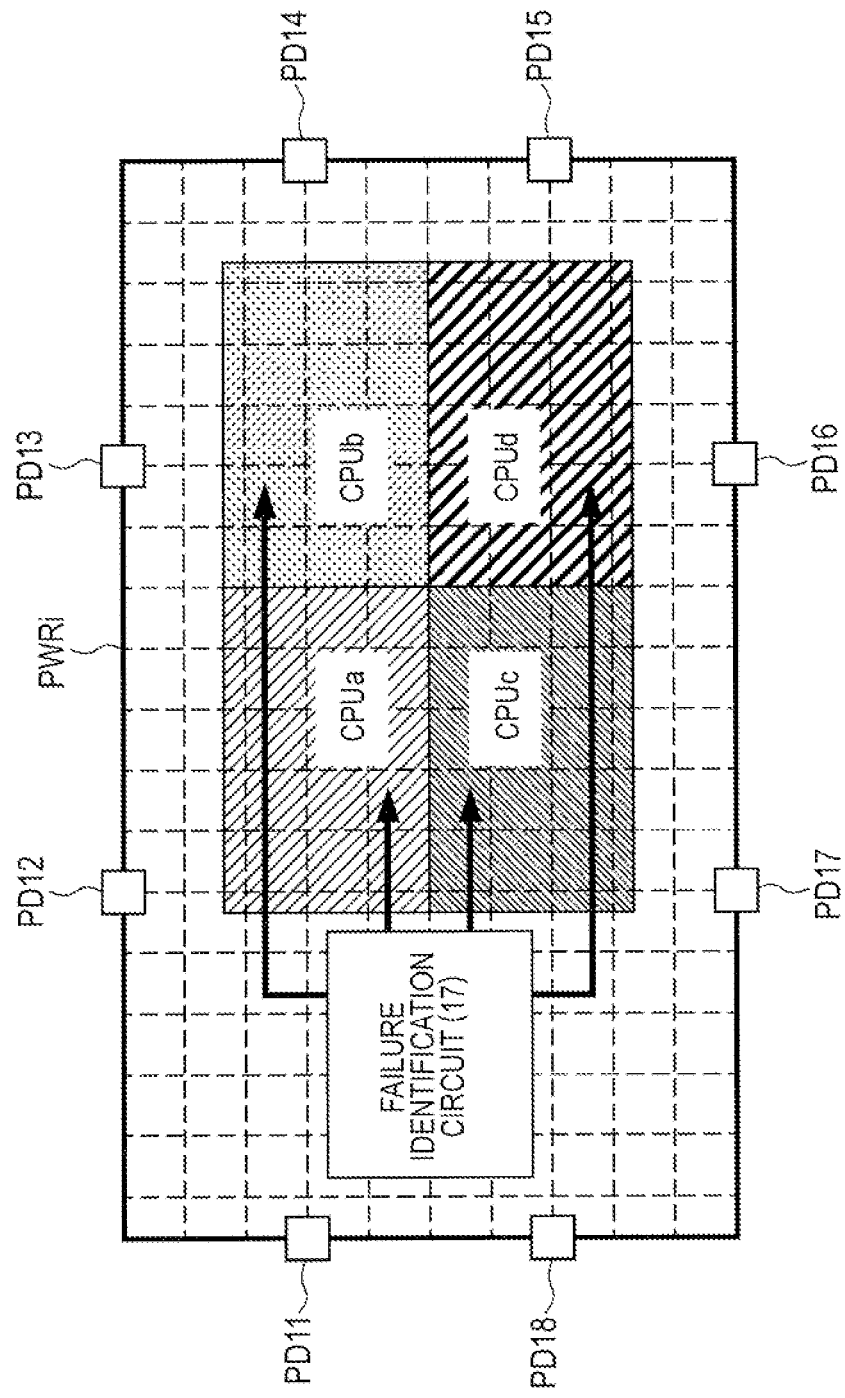
FIG. 13 is a schematic diagram illustrating the arrangement of functional circuits in the semiconductor device according to the fourth embodiment.

For a detailed description of the failure identification circuit 17, FIG. 13 shows the arrangement of the internal power supply wiring network PWRi, internal circuits (e.g., internal circuits CPUa-CPUd), and failure identification circuit 17. As shown in FIG. 13, the semiconductor device 4 according to the fourth embodiment is configured so that the external power supply voltage is supplied to the internal power supply wiring network PWRi through the pads PD11-PD18. The internal power supply wiring network PWRi includes a grid-like wiring network in a region enclosed by the outer circumferential wiring, and gives the external power supply voltage supplied through the wiring network to the internal circuits. The failure identification circuit 17 outputs a control signal to each internal circuit to control the power consumption of each internal circuit on an individual basis.

Figure 14:
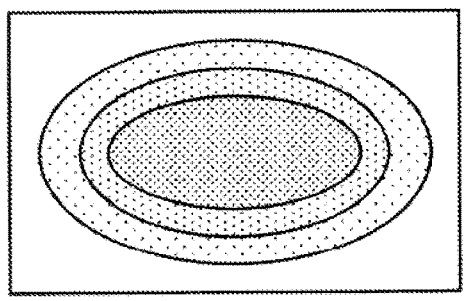
FIG. 14 shows the power supply voltage distribution of a functional circuit arrangement region of the semiconductor device according to the fourth embodiment and a first example depicting the operating states of the functional circuits.

Operations of the semiconductor device 4 according to the fourth embodiment will now be described. FIG. 14 illustrates a voltage distribution within the internal power supply wiring network PWRi that prevails when the pads PD11-PD18 are all normal (e.g., no open circuit is formed), and depicts the operating states of the internal circuits that prevail during the voltage distribution.

When the pads PD11-PD18 are all normal, the degree of voltage drop increases with a decrease in the distance to the center of the region of the internal power supply wiring network PWRi, as shown in FIG. 14. The voltage drops indicated in FIG. 14 are within a normal range from the viewpoint of design. Therefore, the internal circuits CPUa-CPUd are allowed to operate at a specified speed.

Figure 15:
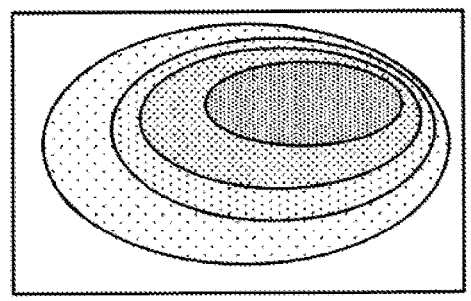
FIG. 15 shows the power supply voltage distribution of a functional circuit arrangement region of the semiconductor device according to the fourth embodiment and a second example depicting the operating states of the functional circuits.

Meanwhile, FIG. 15 shows a case where a failure has occurred. More specifically, FIG. 15 illustrates a voltage distribution within the internal power supply wiring network PWRi that prevails when an open circuit has occurred in the pad PD13, and depicts the operating states of the internal circuits that prevail during the voltage distribution.

In the above case, the greatest voltage drop occurs in a region close to the pad PD13, rather than at the center of the region of the internal power supply wiring network PWRi, as shown in FIG. 15. The reason is that an internal circuit (e.g., CPUb) supposed to receive electrical power from the pad PD13 receives electrical power from the other pads as the external power supply from the pad PD13 is shut off. Further, the amount of the greatest voltage drop in the example shown in FIG. 15 is larger than the amount of the greatest voltage drop indicated in FIG. 14, which illustrates a normal state. Hence, the failure identification circuit 17 exercises control to reduce the operating speed of the internal circuit CPUb, which is located in a region where the greatest voltage drop occurs, and decrease the amount of the voltage drop for the purpose of preventing the internal circuit CPUb from becoming abnormal in such a situation.

The degree of voltage drop occurring in the region of the internal power supply wiring network PWRi varies with the number of abnormal pads and with the locations of the abnormal pads. FIG. 16 is a table illustrating the failure modes of the semiconductor device 4 according to the fourth embodiment and an internal circuit control operation performed in each failure mode.

As shown in FIG. 16, if an open circuit is detected in one of the pads PD11-PD18, the failure identification circuit 17 selects a low-speed mode so that an internal circuit located close to the open-circuited pad operates at a low speed. If an open circuit is simultaneously detected in two pads close to the internal circuits, the failure identification circuit 17 selects a HALT mode so that the internal circuits close to the open-circuited pads consume less electrical power than in the low-speed mode. If two internal circuits are determined to be incapable of maintaining a normal operation, the failure identification circuit 17 selects a stop mode to stop the operation of the semiconductor device 4.

As described above, the semiconductor device 4 according to the fourth embodiment detects an open circuit in more pads than in the semiconductor device according to the other embodiments. This allows the semiconductor device 4 according to the fourth embodiment to control the internal circuits more precisely.

Further, the semiconductor device 4 according to the fourth embodiment also detects an open circuit in the wiring related to a pad. This detection is accomplished by measuring a voltage drop in the vicinity of a pad that supplies a power supply voltage to the internal power supply wiring network PWRi from the outside of the semiconductor device 4. Consequently, the semiconductor device 4 can detect an abnormal state in which the internal circuits cannot maintain their normal state without interrupting their operations, as is the case with the semiconductor devices according to the other embodiments.

Fifth Embodiment

A fifth embodiment of the present invention will now be described with reference to an example in which a ground voltage is supplied as the external power supply voltage in the semiconductor device 4 according to the fourth embodiment. FIG. 17 is a block diagram illustrating the semiconductor device 5 according to the fifth embodiment. As regards the description of the fifth embodiment, elements identical with those described in conjunction with the foregoing embodiments are designated by the same reference numerals as the corresponding elements of the foregoing embodiments and will not be redundantly described.

As shown in FIG. 17, in semiconductor device 5 according to the fifth embodiment, the pads PD11-PD18 operate so that an external power supply wiring network GNDe disposed outside of the semiconductor device 5 supplies a ground voltage as the external power supply voltage. The semiconductor device 5 according to the fifth embodiment includes power supply inspection circuits 511-518 in place of the power supply inspection circuits 111-118 of the semiconductor device 4.

The power supply inspection circuits 511-518 are disposed in the semiconductor device 5 to detect a ground voltage increase in an internal power supply wiring network GNDi that receives the ground voltage supplied from the pads PD11-PD18. More specifically, the power supply inspection circuits 511-518 detect that the ground voltage in the vicinity of the pads PD11-PD18 is higher than a predetermined threshold voltage.

Figure 18:
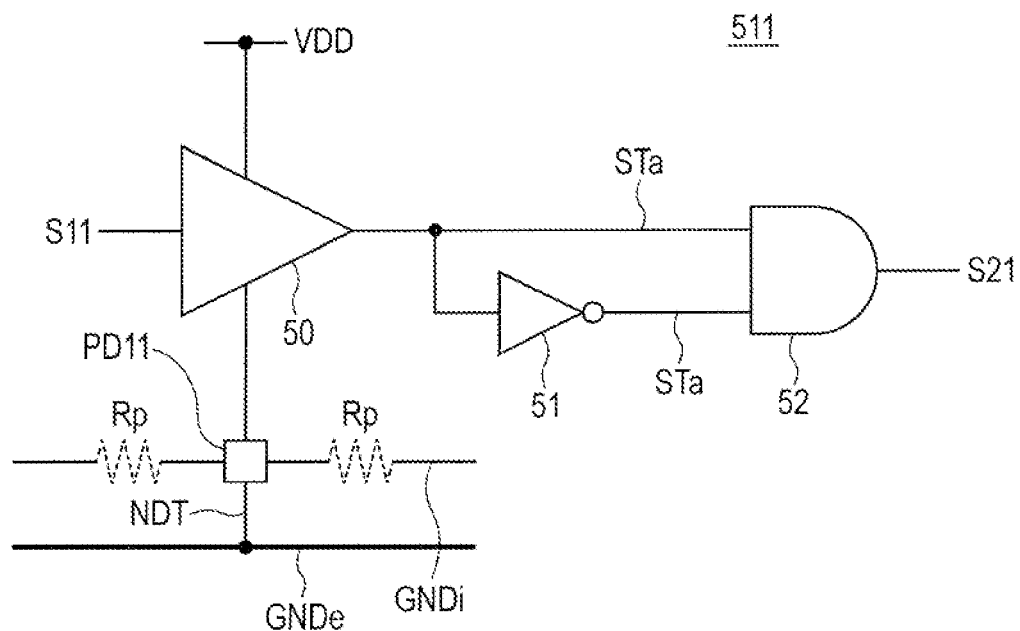
FIG. 18 is a circuit diagram illustrating a power supply inspection circuit of the semiconductor device according to the fifth embodiment.

The power supply inspection circuits 511-518 will now be described in further detail. The power supply inspection circuits 511-518 each include a power supply wiring inspection circuit that has a circuit configuration similar to that of the power supply wiring inspection circuit 21a shown in FIG. 2 and detects an increase in the ground voltage. As the power supply inspection circuits 511-518 are substantially identical with each other, only the power supply inspection circuit 511 will be described to omit the description of the other power supply inspection circuits. FIG. 18 is a circuit diagram illustrating the power supply inspection circuit 511.

As shown in FIG. 18, the power supply inspection circuit 511 includes a buffer 50, an inverter 51, and an inverted OR circuit 52. The buffer 50 transmits a received test pulse signal S11 to a subsequent circuit. The buffer 30 operates on an internal power supply voltage VDD supplied as the external power supply voltage VDDC and on the ground voltage supplied to a monitoring point (the pad PD11 in the example shown in FIG. 18).

The inverter 51 inverts an output signal STa of the buffer 50 and transmits the resulting inverted signal to a subsequent circuit. The inverted OR circuit 52 outputs an inverted logical sum of the output signal STa of the buffer 50 and an output signal STb of the inverter 51 as the wiring inspection result signal S21. The inverter 51 also functions as a delay circuit that gives a delay to the output signal STa of the buffer 50. Although the operating power supplies for the inverter 51 and for the inverted OR circuit 52 are not explicitly indicated in FIG. 18, it is preferred that these circuits also operate on the internal power supply voltage VDD and on the ground voltage supplied to the pad PD11.

In other words, the power supply inspection circuit 511 is similar to the power supply wiring inspection circuit 21a in that when the voltage at the monitoring point increases, the gradient of the rise and fall of the output signal STa decreases due to a decrease in the operating power supply voltage range of the buffer 50 (the difference between the internal power supply voltage VDD and the ground voltage). Therefore, when the ground voltage exceeds the predetermined threshold voltage, the power supply inspection circuit 511 generates a pulse as the wiring inspection result signal S21, as is the case with the power supply wiring inspection circuit 21a.

As described above, the semiconductor device 5 according to the fifth embodiment includes the power supply inspection circuit 511. This makes it possible to detect an open circuit related to a pad to which the ground voltage is given, as is the case with the other embodiments.

In the foregoing embodiments, a power supply voltage and a ground voltage are monitored. However, the voltages to be monitored are not limited to the power supply voltage and ground voltage. Any voltage related to a pad that is coupled to a loop—like wiring in the semiconductor device may be monitored. Further, the semiconductor device according to the foregoing embodiments provides an advantage of being able to detect an open circuit in a wiring related to a pad no matter whether the pads are coupled with an externally disposed loop—like wiring or coupled with a wiring in the semiconductor device. Moreover, the semiconductor device according to the foregoing embodiments provides an advantage of being able to detect a failure that may incur an abnormal operation of the internal circuits, without sacrificing the performance of the internal circuits disposed inside the semiconductor device.

While the present invention contemplated by its inventors has been described in detail in terms of preferred embodiments, it is to be understood that the present invention is not limited to those preferred embodiments, but extends to various modifications that nevertheless fall within the spirit and scope of the appended claims.

What is claimed is:

1. A semiconductor device comprising:
   a plurality of functional circuits;
   a power supply wiring network that supplies a power supply voltage to the functional circuits;
   a plurality of pads configured to couple the power supply wiring network to circuitry outside of the semiconductor device;
   a plurality of power supply inspection circuits that monitor the voltage at a monitoring point provided for each of the pads and check for an abnormality in the power supply wiring network; and
   a result storage register that stores an inspection result derived from the power supply inspection circuits;
   wherein the functional circuits each include a constant-voltage generation circuit, which generates an internal power supply voltage, and an internal circuit, which exercises a predetermined function,
   wherein the power supply wiring network includes a first internal power supply wiring network, which receives the supply of an external power supply voltage generated by an external power supply disposed outside of the semiconductor device, and a second internal power supply wiring network, which receives the supply of the internal power supply voltage, and wherein the pads include a first pad, which transmits the external power supply voltage to the first internal power supply wiring network, and a second pad, which couples the second internal power supply wiring network to a capacitive element disposed outside of the semiconductor device.

2. The semiconductor device according to claim 1, further comprising:
a failure identification circuit that includes the result storage register and selects a low power consumption setting for the functional circuits in accordance with the inspection result stored in the result storage register.

3. The semiconductor device according to claim 1, wherein the monitoring point is disposed between the pads and a region where the functional circuits are disposed.

4. The semiconductor device according to claim 1, wherein the power supply inspection circuits each include:
a first power supply inspection circuit, which is provided for the first pad to detect a first abnormal state when the external power supply voltage supplied to the first pad is lower than a predetermined voltage threshold value; and
a second power supply inspection circuit, which is provided for the second pad to detect a second abnormal state when noise of the internal power supply voltage is greater than a predetermined noise threshold value.

5. The semiconductor device according to claim 4, further comprising:
a failure identification circuit that includes the result storage register, references the inspection result stored in the result storage register, and changes the operating state of the internal circuit depending on whether the first or second abnormal state is detected.

6. The semiconductor device according to claim 5, wherein the failure identification circuit includes a plurality of failure identification sub-circuits that individually control the power supply inspection circuits.

7. The semiconductor device according to claim 6, wherein the power supply inspection circuits each include a power supply wiring inspection circuit that detects an abnormal state if the external power supply voltage in the vicinity of first pad is lower than a predetermined voltage threshold value.

8. The semiconductor device according to claim 7, wherein:
the failure identification circuit includes the result storage register and, in accordance with the inspection result stored in the result storage register, selects a low power consumption setting for one of the functional circuits that is positioned close to a monitoring point associated with a power supply inspection circuit that has detected the abnormal state.

9. The semiconductor device according to claim 6, wherein the power supply inspection circuits each include a power supply quality inspection circuit that detects an abnormal state when noise of the internal power supply voltage in the vicinity of the second pad is greater than a predetermined noise threshold value.

10. A semiconductor device comprising:
a plurality of functional circuits;
a plurality of external power pads, each configured to receive an external power supply voltage;
a first internal power supply wiring network coupled to each of the plurality of external power pads and configured to supply the external power supply voltage within the semiconductor device;
a plurality of power supply inspection circuits configured to monitor the voltage at a monitoring point provided for a corresponding external power pad and check for an abnormality in the first internal power supply wiring network; and
a failure identification circuit configured to control an operating state of one or more of the plurality of functional circuits, in response to an abnormality detected in the first internal power supply wiring network; and further comprising:
a plurality of local power pads, each configured to be coupled to a capacitive element disposed outside of the semiconductor device; and
a second internal power supply wiring network coupled to each of the plurality of local power pads and configured to supply an internal power supply voltage within the semiconductor device; wherein:
the plurality of power supply inspection circuits include circuits configured to monitor the voltage at a monitoring point provided for a corresponding local power pad and check for an abnormality in the second internal power supply wiring network; and
the failure identification circuit is further configured to control an operating state of one or more of the plurality of functional circuits, in response to an abnormality detected in the second internal power supply wiring network.

11. The semiconductor device according to claim 10, wherein:
the failure identification circuit is configured to reduce a clock speed of one or more of the plurality of functional circuits, in response to an abnormality detected in one or more of the first internal power supply wiring network and the second internal power supply wiring network.

12. The semiconductor device according to claim 10, wherein:
the failure identification circuit comprises a plurality of failure identification sub-circuits, each failure identification sub-circuit associated with a corresponding functional circuit;
each failure identification sub-circuit is configured to control a corresponding one of the power supply inspection circuits; and
the failure identification circuit is configured to detect abnormalities simultaneously occurring in both the first internal power supply wiring network and the second internal power supply wiring.

13. The semiconductor device according to claim 12, wherein the power supply inspection circuits include:
power supply wiring inspection circuits, each power supply wiring inspection circuit configured to detect an abnormal state, if the external power supply voltage in the vicinity of the corresponding external power pad is lower than a predetermined voltage threshold value; and
power supply quality inspection circuits, each power supply quality inspection circuit configured to detect an abnormal state, if the noise of the internal power supply voltage in the vicinity of the corresponding local pad is greater than a predetermined noise threshold value.

* * * * *